(12) United States Patent
Wu

(10) Patent No.: US 9,214,450 B2
(45) Date of Patent: Dec. 15, 2015

(54) PACKAGE-ON-PACKAGE WITH VIA ON PAD CONNECTIONS

(71) Applicant: Taiwan Semiconductor Manufacturing Company, Ltd., Hsin-Chu (TW)

(72) Inventor: Jiun Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/157,745

(22) Filed: Jan. 17, 2014

(65) Prior Publication Data

US 2014/0264857 A1 Sep. 18, 2014

Related U.S. Application Data

(60) Provisional application No. 61/778,226, filed on Mar. 12, 2013.

(51) Int. Cl.

| | |
|---|---|
| H01L 23/48 | (2006.01) |
| H01L 25/065 | (2006.01) |
| H01L 23/00 | (2006.01) |
| H01L 25/10 | (2006.01) |
| H01L 23/13 | (2006.01) |
| H01L 21/683 | (2006.01) |
| H01L 23/498 | (2006.01) |
| H01L 21/56 | (2006.01) |
| H01L 25/00 | (2006.01) |

(52) U.S. Cl.
CPC ........ *H01L 25/0657* (2013.01); *H01L 21/6835* (2013.01); *H01L 23/13* (2013.01); *H01L 23/49811* (2013.01); *H01L 23/49816* (2013.01); *H01L 23/49822* (2013.01); *H01L 23/49827* (2013.01); *H01L 24/19* (2013.01); *H01L 25/105* (2013.01); *H01L 21/568* (2013.01); *H01L 23/48* (2013.01); *H01L 23/481* (2013.01); *H01L 23/498* (2013.01); *H01L 24/32* (2013.01); *H01L 24/48* (2013.01); *H01L 24/73* (2013.01); *H01L 25/50* (2013.01); *H01L 2221/68345* (2013.01); *H01L 2221/68372* (2013.01); *H01L 2221/68381* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2225/0651* (2013.01); *H01L 2225/1035* (2013.01); *H01L 2225/1058* (2013.01); *H01L 2924/15311* (2013.01)

(58) Field of Classification Search
CPC ...... H01L 23/48; H01L 23/481; H01L 23/498
USPC .......................................... 257/621, 667, 779
See application file for complete search history.

(56) References Cited

U.S. PATENT DOCUMENTS

| | | | |
|---|---|---|---|
| 2008/0258285 A1* | 10/2008 | Harper et al. | 257/686 |
| 2013/0168856 A1* | 7/2013 | Wang et al. | 257/738 |
| 2013/0214431 A1* | 8/2013 | Lin et al. | 257/777 |
| 2013/0249115 A1* | 9/2013 | Lin et al. | 257/777 |
| 2014/0264811 A1* | 9/2014 | Wu | 257/686 |
| 2014/0264857 A1* | 9/2014 | Wu | 257/738 |

\* cited by examiner

*Primary Examiner* — Nicholas Tobergte
(74) *Attorney, Agent, or Firm* — Slater & Matsil, L.L.P.

(57) ABSTRACT

An interposer includes a core dielectric material, a conductive pipe penetrating through the core dielectric material, and a metal pad underlying the conductive pipe. The metal pad includes a center portion overlapped by a region encircled by the conductive pipe, and an outer portion in contact with the conductive pipe. A dielectric layer is underlying the core dielectric material and the metal pad. A via is in the dielectric layer, wherein the via is in physical contact with the center portion of the metal pad.

20 Claims, 11 Drawing Sheets

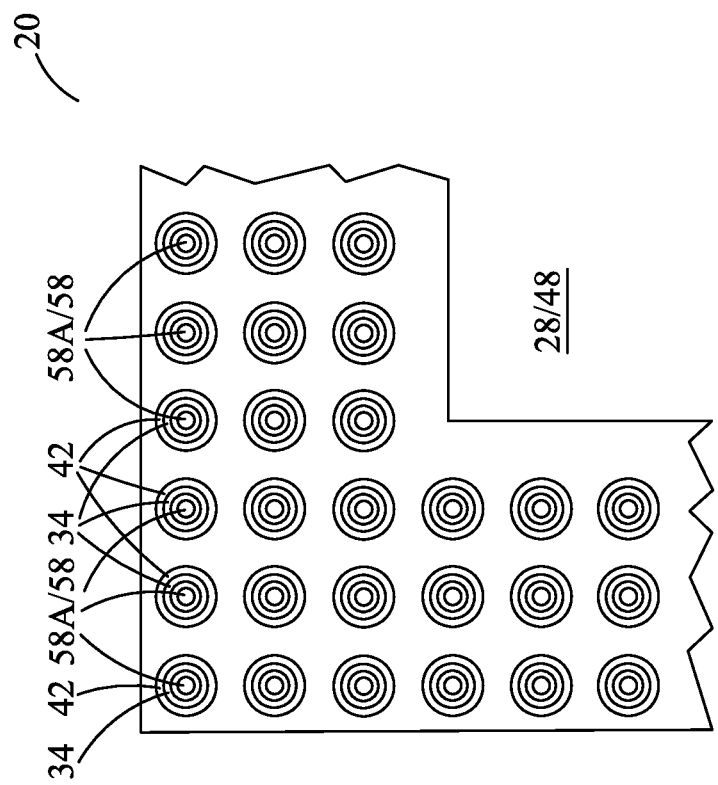

PACKAGE-ON-PACKAGE WITH VIA ON PAD CONNECTIONS

PRIORITY CLAIM AND CROSS-REFERENCE

This application claims the benefit of the following provisionally filed U.S. patent application Ser. No. 61/778,226, filed Mar. 12, 2013, and entitled "Package-on-Package with Via on Pad Connections;" which application is hereby incorporated herein by reference.

BACKGROUND

In a conventional Package-on-Package (PoP) process, a top package is bonded to a bottom package. The top package and the bottom package are pre-formed before bonded to each other. The top package and the bottom package may also have device dies therein. By adopting the PoP process, the integration level of the packages may be increased.

In an existing PoP process, the formation of the bottom package includes bonding a device die to a package substrate. A molding compound is then molded on the package substrate, wherein the device die is molded in the molding compound. The package substrate further includes solder balls formed thereon, wherein the solder balls and the device die are on a same side of the package substrate. The solder balls are used for bonding the top package to the bottom package. Accordingly, to allow an adequate space for the device die, the heights of the solder balls need to be greater than the thickness of the device die, so that the top portions of the solder balls may protrude higher than the top surface of the device die, and higher than the top surface of the molding compound. Accordingly, the sizes of the solder balls are also large, and the number of the solder balls that can be used in a PoP structure is limited. In addition, with the large solder balls, the distance between neighboring solder balls also needs to be increased to prevent bridging.

Furthermore, the top package may also include solder regions formed thereon in order to connect to the solder balls in the bottom package. The large size of the solder balls and the additional solder from the top package makes it very difficult to prevent the bridging of solder balls while maintain the pitches of the solder balls to be small at the same time.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Package-On-Package (POP) structure and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1A:
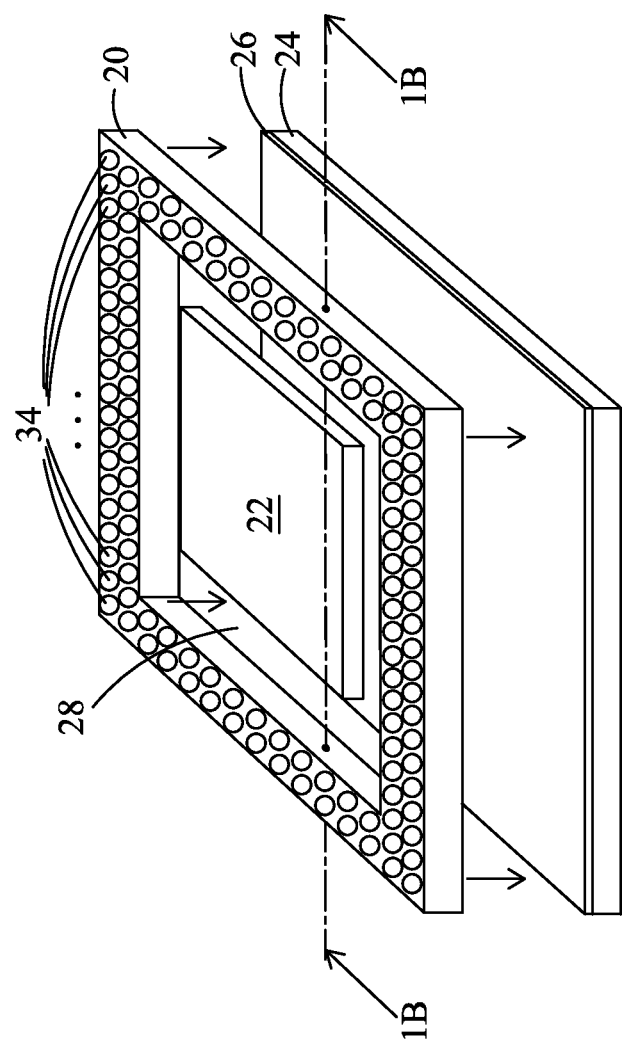
FIGS. 1A through 8 are cross-sectional views, perspective views, and top views of intermediate stages in the manufacturing of a Package-on-Package (POP) structure in accordance with some exemplary embodiments.

FIGS. 1A through 8 illustrate the perspective views, top views, and cross-sectional views of intermediate stages in the formation of a POP structure. FIGS. 1A and 1B illustrate a perspective view and a cross-sectional view, respectively, in the attachment of interposer 20 and device die 22 to carrier 24. Referring to FIG. 1A, in some embodiments, carrier 24 is a glass carrier, a ceramic carrier, an organic carrier, or the like. The attachment may be achieved through adhesive 26, which may be, for example, a Ultra-Violet (UV) adhesive that loses adhesion when exposed to UV light. Device die 22 may be a logic die, a memory die, or the like, which comprises transistors (not shown) therein. In some exemplary embodiments, device die 22 is a Central Processing Unit (CPU) die. It is appreciated that although component 22 is a device die in some embodiments, in other embodiments, it may be a package, which includes, for example, a device die bonded to an interposer (not shown). Interposer 20 includes through-opening 28 therein, which may be located in a center region of interposer 20. Device die 22 is dispensed in through-opening 28 and attached to carrier 24. For example, device die 22 may be in contact with adhesive 26.

Figure 1B:
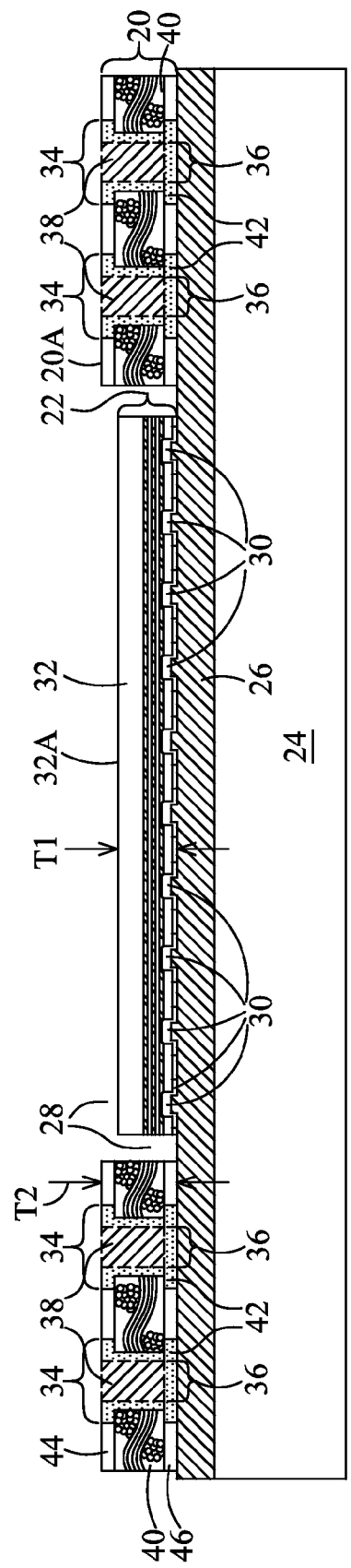

FIG. 1B illustrates a cross-sectional view of the structure in FIG. 1A, wherein the cross-sectional view is obtained from the plane crossing line 1B-1B in FIG. 1A. The cross-sectional view illustrates the structure after device die 22 and interposer 20 have been attached to carrier 24. As shown in FIG. 1B, device die 22 is dispensed facing down, and electrical connectors 30 of device die 22 are on the bottom side of device die 22. In some embodiments, electrical connectors 30 are metal pads, metal pillars (metal bumps), and/or the like, and are electrically coupled to the integrated circuit devices (not shown) inside device die 22. Device die 22 further includes semiconductor substrate 32, which has back surface 32A facing up. Back surface 32A may be lower than or level with back surface 20A of interposer 20. Hence, thickness T1 of device die 22 may be substantially equal to or smaller than thickness T2 of interposer 20.

Interposer 20 includes core dielectric material 40. In some exemplary embodiments, core dielectric material 40 comprises one or more material selected from epoxy, resin, glass fiber, prepreg (which comprises epoxy, resin, and/or glass fiber), resin coated Copper (RCC), glass, molding compound, plastic (such as PolyVinylChloride (PVC), Acrylonitril, Butadiene & Styrene (ABS), Polypropylene (PP), Polyethylene (PE), PolyStyrene (PS), Polymethyl Methacrylate (PMMA), Polyethylene Terephthalate (PET), Polycarbonates (PC), Polyphenylene sulfide (PPS), flex (polyimide), combinations thereof, and multi-layers thereof. Core material 40 may also be formed of Cu, alloy, silicon (in the form of silicon wafer), or the like. In which embodiments, however, since core material 40 is conductive or semi-conductive, insulation layers are needed to insulate the conductive features (such as conductive pipes 34) from core material 40. In addition to core material 40, dielectric layers 44 and 46 may be formed on the opposite sides of core material 40. Dielectric layers 44 and 46 may also be formed of oxides, molding compounds, organic materials, or the like.

As shown in FIG. 1B, interposer 20 also includes conductive pipes 34. Conductive pipes form rings (in the top view of FIG. 1B) encircling openings 36 (also refer to FIG. 2B), which are illustrated as filled with sacrificial material 38. The bottom ends of conductive pipes 34 are in contact with, and hence are closed by, conductive pads 42, while the top ends of conductive pipes 34 are open. In FIG. 1B, conductive pipes 34 are empty inside. Conductive pipes 34 may comprise copper, aluminum, tungsten, nickel, or combinations thereof. In some embodiments, openings 36 are filled with sacrificial materials 38, so that in the subsequent molding process, molding material 48 (FIGS. 2A and 2B) does not fill into openings 36. In alternative embodiments, openings 36 are left unfilled. In the embodiment wherein openings 36 are filled with sacrificial material 38, sacrificial material 38 may be, for example, light-sensitive materials such as polyimide, polybenzoxazole (PBO), oxides, or other materials that can be removed easily in the subsequent process without damaging interposer 20.

Metal pads 42 are formed underlying conductive pipes 34. Each of metal pads 42 includes a center portion aligned to the respective openings 36. Each of metal pads 42 may also include an outer portion aligned to, and connected to, the respective overlying conductive pipe 34. Furthermore, the outer portions of metal pads 42 are in physical contact with the bottom edges of conductive pipes 34. The center portions of metal pads 42 are exposed to openings 36. In the embodiments in which sacrificial material 38 is filled in openings 36, sacrificial material 38 resides over and is in contact with the center portions of metal pads 42.

Figure 2A:
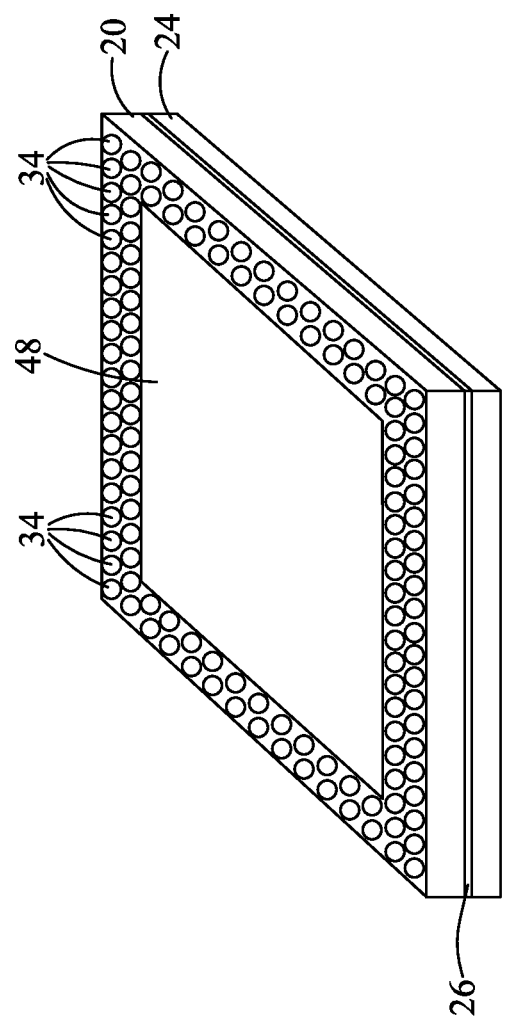
Figure 2B:
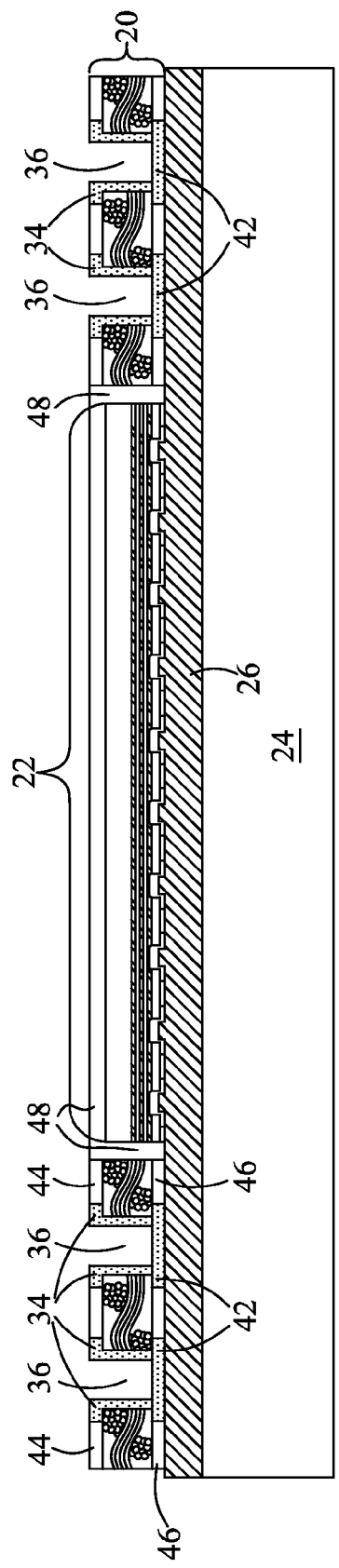

Referring to FIGS. 2A and 2B, which are a perspective view and a cross-sectional view, respectively, molding material 48 is molded on interposer 20 and device die 22, followed by a planarization step to expose conductive pipes 34. Molding material 48 may include a molding compound, a molding underfill, or the like. Molding material 48 fills the remaining through-opening 28, and may include a portion overlapping device die 22. Furthermore, molding material 48 extends to contact adhesive 26. Accordingly, the top surface and the bottom surface of molding material 48 may be leveled with the top surface and the bottom surface, respectively, of interposer 20. In the embodiments sacrificial material 38 fills openings 36 (FIG. 1B), sacrificial material 38 is removed from openings 36. Otherwise, the portions of molding material 48 filling openings 36 are removed. As a result, as shown in FIG. 2B, openings 36 are revealed, and the center portions of metal pads 42 are exposed to openings 36.

Figure 3:
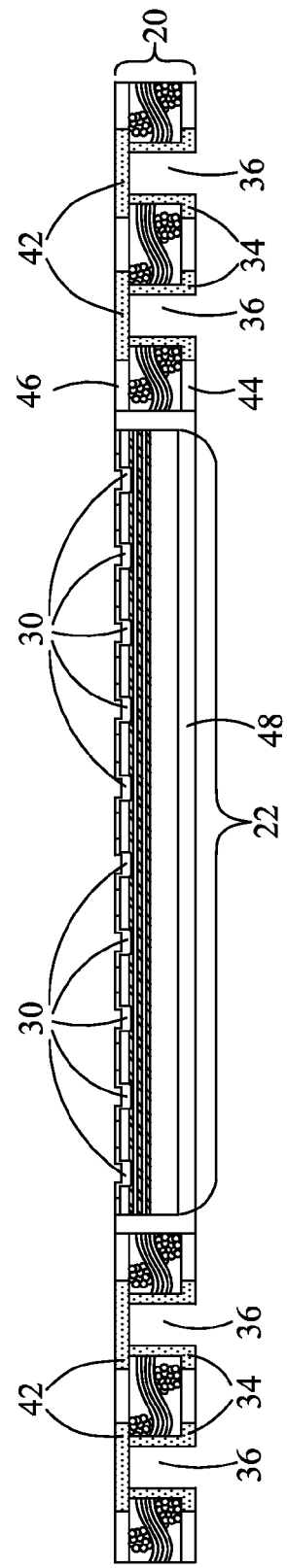
Figure 4:
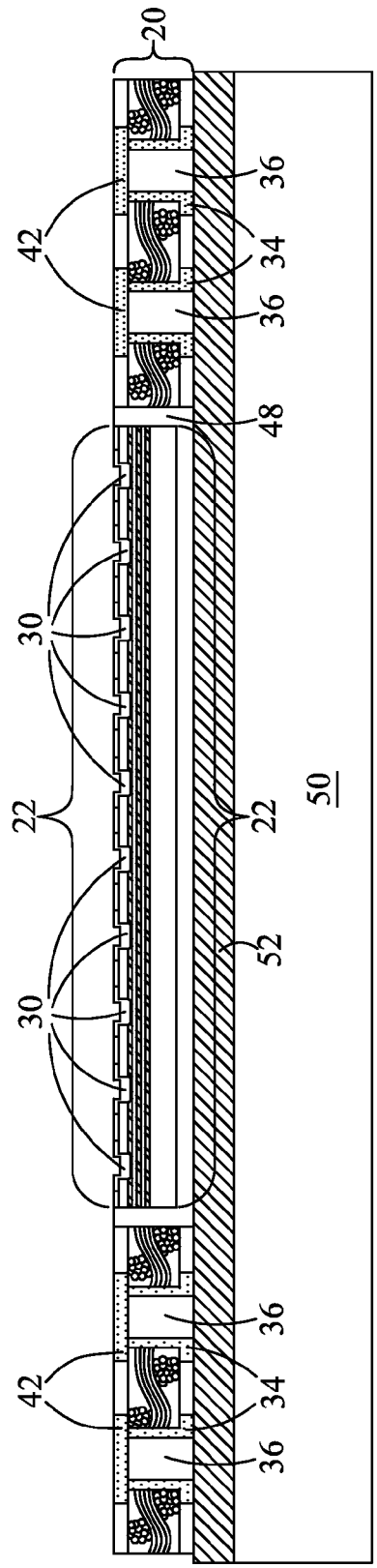
Figure 5A:
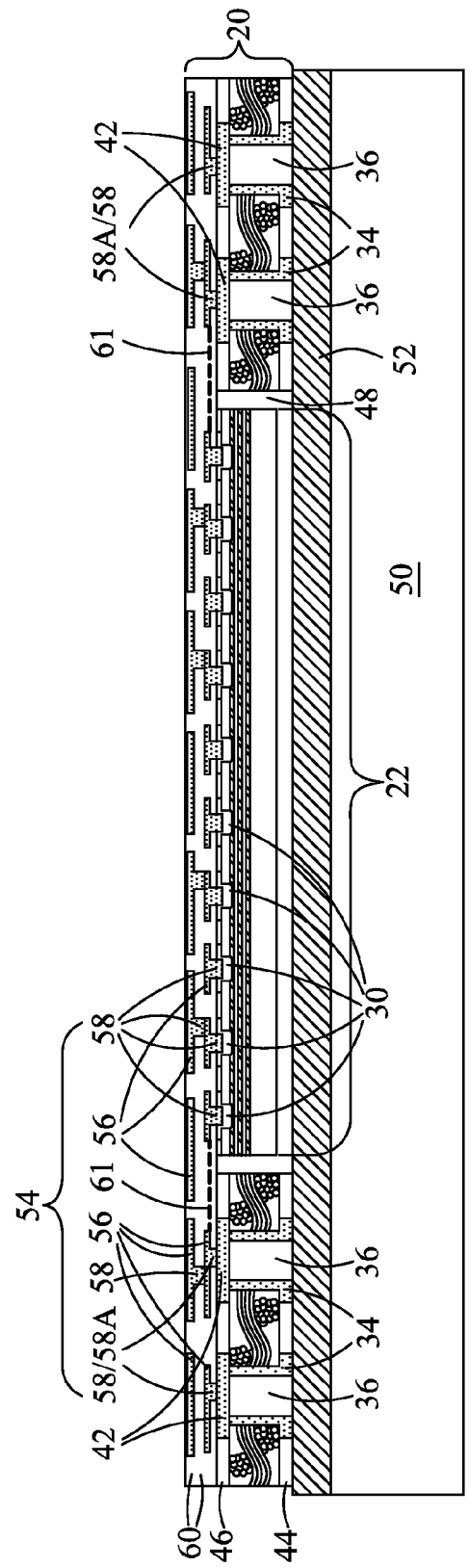
Figure 6:
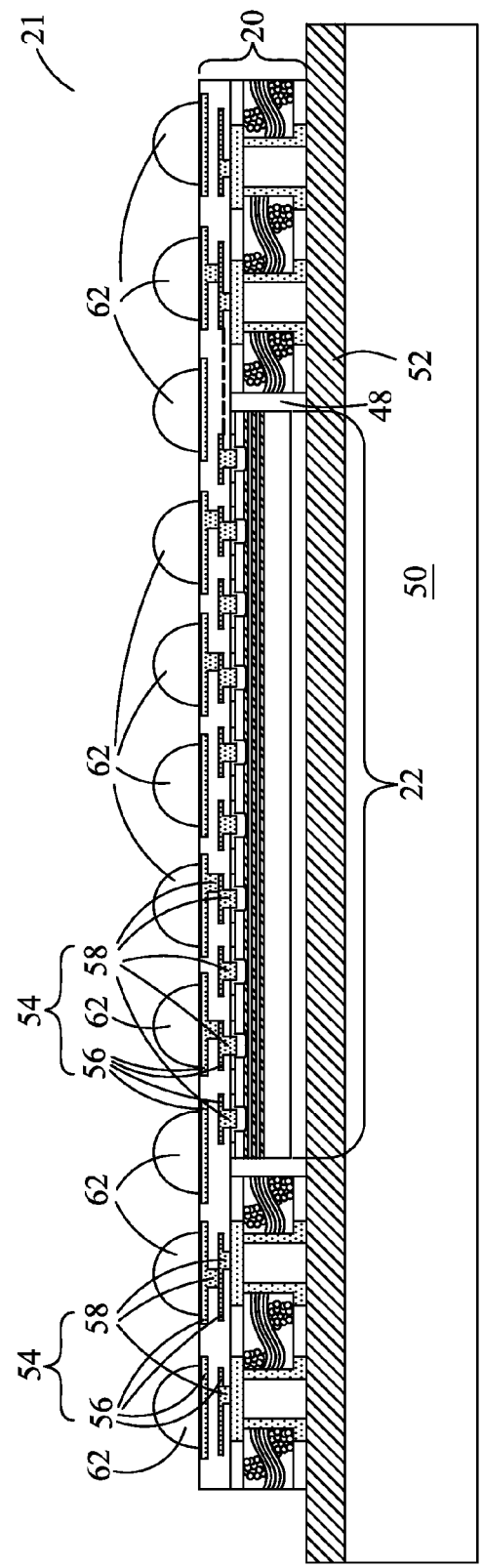

In some embodiments, as shown in FIGS. 3 and 4, a carrier switch is performed. In the carrier switch process, carrier 50, as shown in FIG. 4, is first attached to interposer 20, wherein carriers 50 and carrier 24 (FIG. 1) are on the opposite sides of interposer 20. Carrier 50 may be attached to interposer 20 through adhesive 52, which may be a UV glue, a tape, or the like. Carrier 24 (FIG. 3) is then detached from interposer 20. The resulting structure is shown in FIG. 4. In alternative embodiments, if interposer 20 has an adequate mechanical strength, the carrier switch is not performed, and the subsequent steps shown in FIGS. 5A, 5B, and 6 are performed without carrier 50.

After the carrier switch, as shown in FIG. 4, metal pads 42 and electrical connectors 30 of device die 22 are exposed. Next, referring to FIG. 5A, dielectric layers 60 are formed over interposer 20 and device die 22. Redistribution Lines (RDLs) 54, which include metal lines 56 and vias 58, are formed in dielectric layers 60. RDLs 54 are also electrically connected to conductive pipes 34 and electrical connectors 30. RDLs 54 may also interconnect conductive pipes 34 and electrical connectors 30, wherein the interconnection is illustrate using dashed lines 61, which also represent parts of RDLs 54. There may be one, two, three, or more redistribution layers, each including a plurality of RDLs 54 that is at the same level. The vias 58 in the bottom redistribution layer and the respective dielectric layer 60 have bottom surfaces in contact with metal pads 42 and electrical connectors 30. In some embodiments, RDLs 54 are formed by forming and patterning dielectric layers 60, and forming RDLs 54 in the openings in the patterned dielectric layers 60. In alternative embodiments, RDLs 54 are formed by depositing metal layers, patterning the metal layers, and filling the gaps between RDLs 54 with dielectric layers 60. In yet alternative embodiments, RDLs 54 and dielectric layers 60 are formed using damascene processes.

RDLs 54 may comprise copper, nickel, palladium, aluminum, tungsten, or the like. Dielectric layers 60 may comprise photo-sensitive materials such as polyimide, PBO, or the like, which may be patterned without using additional photo resists. Dielectric layers 60 may also be formed of inorganic materials such as oxides and/or nitrides.

Vias 58 include bottom vias 58A, which are in physical contact with, and are electrically connected to, metal pads 42. Furthermore, in some embodiments, a part or an entirety of a via 58 may overlap the respective overlying opening 36 (and hence overlaps the center portion of the respective overlying metal pad 42). Accordingly, different from conventional core-substrate structures, vias 58 may utilize the space directly over the spaces encircled by conductive pipes 34. This provides more flexibility in the routing of RDLs 54, and RDLs 54 may be shortened.

FIG. 5B illustrates a top view of a portion of interposer 20. FIG. 5B shows that vias 58A are aligned to the spaces encircled by conductive pipes 34. Furthermore, vias 58 are aligned to the center portions of metal pads 42. The top-view shapes of conductive pipes 34 may be circles, squares, rectangles, hexagons, or other applicable shapes.

FIG. 6 illustrates the formation of electrical connectors 62 in accordance with some exemplary embodiments. The formation of connectors 62 may include placing solder balls on the exposed portions of RDLs 54, and then reflowing the solder balls. In alternative embodiments, the formation of connectors 62 includes performing a plating step to form solder regions over RDLs 54, and then reflowing the solder regions. Connectors 62 may also include metal pillars, or metal pillars and solder caps, which may also be formed through plating. Throughout the description, the structure including interposer 20, device die 22, and molding material 48, etc., as shown in FIG. 6, is referred to as package 21, which is an integrated unit. Package 21 is then demounted from carrier 50, for example, by exposing adhesive 52 to a ultra-violet (UV) light when adhesive 52 is an UV adhesive.

Figure 7:
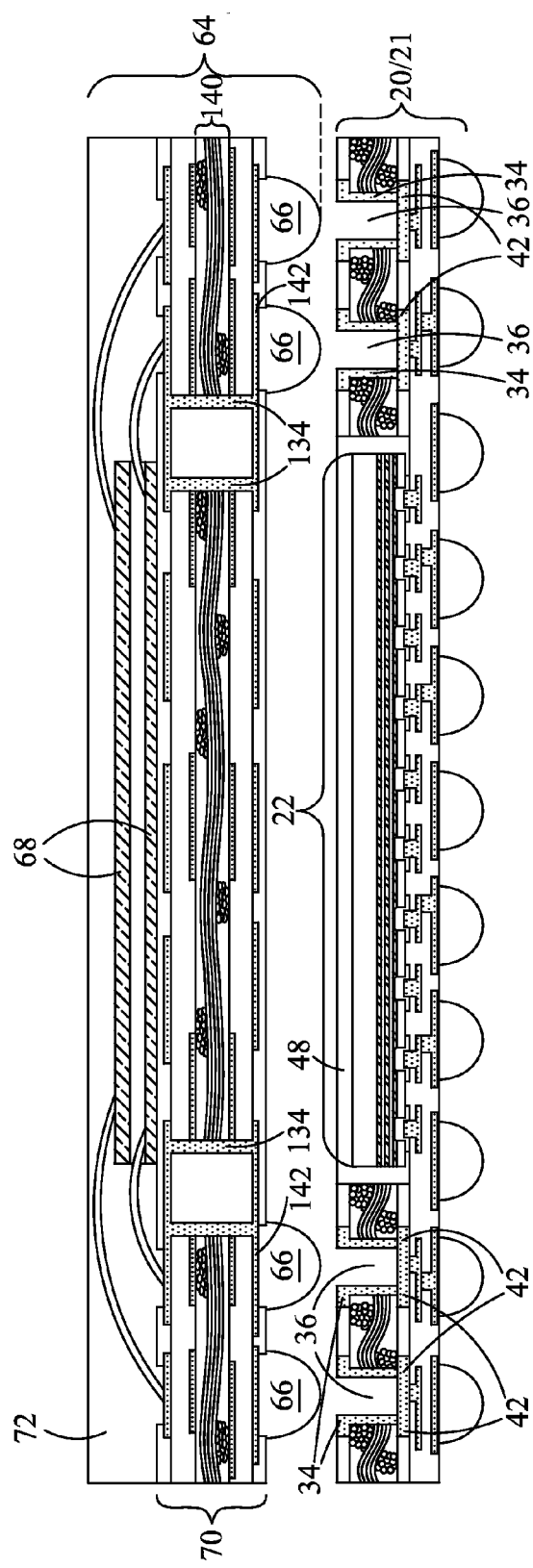

Referring to FIG. 7, top package 64 is placed against package 21, which includes interposer 20 and device die 22 therein. Top package 64 may be a package that includes device dies 68 and package substrate 70, wherein device dies 68 are bonded to package substrate 70. In some exemplary embodiments, device dies 68 comprise memory dies such as Static Random Access Memory (SRAM) dies, Dynamic Random Access Memory (DRAM) dies, or the like. Furthermore, molding material 72 may be pre-molded on device dies 68 before the bonding of top package 64 to interposer 20. In alternative embodiments, package substrate 70 is bonded to interposer 20 first, and then device dies 68 are bonded to package substrate 70. Molding material 72 is then molded onto device dies 68 and package substrate 70.

Package substrate 70 may include core material 140, vias 134 penetrating through core material 140, and metal pads 142 connected to vias 134. Metal pads 142 may be misaligned with the respective connecting vias 134, although they can also be aligned to the respective connecting vias 134. In some embodiments, solder balls 66 of package substrate 70 are bonded to metal pads 142, and are aligned to openings 36 of conductive pipes 34. The sizes of solder balls 66 is controlled so that the amount of solder in solder balls 66 may fill up openings 36 without too much excess.

Figure 8:
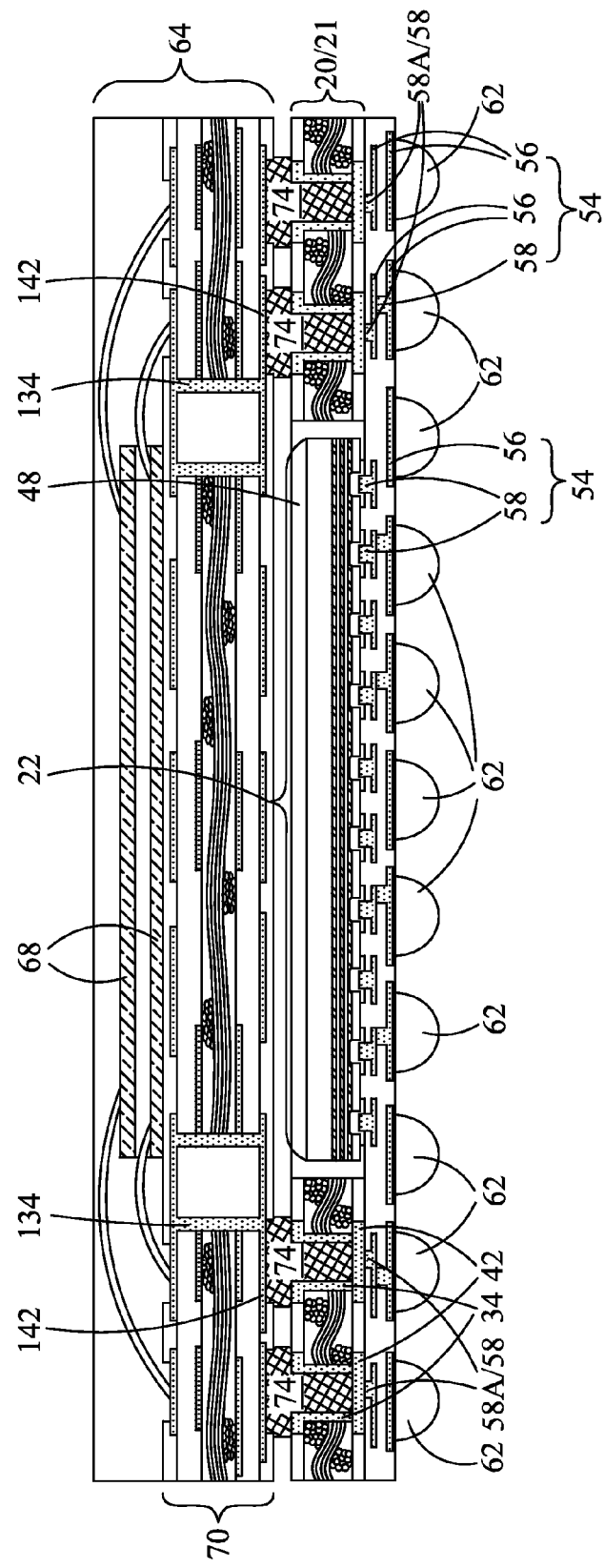

Referring to FIG. 8, after solder balls 66 are put into contact with conductive pipes 34, a reflow is performed to bond top package 64 to interposer 20. Solder regions 74, which are formed of the molten solder balls 66 in FIG. 7, flow to fill openings 36, and electrically couple top package 64 to conductive pipes 34. When top package 64 is bonded to interposer 20, the lateral expansion of solder regions 74 is minimized due to the function of conductive pipes 34, and the pitches of the solder regions 66 may be made small without causing the increase in the risk of bridging neighboring solder regions 74. In accordance with the embodiments of the present disclosure, the pitches of solder regions 66 may be smaller than about 150 µm.

In the embodiments of the present disclosure, a device die is embedded in the through-opening in an interposer, rather than formed on a side of an interposer as in the conventional packages. The Coefficient of Thermal Expansion (CTE) of the substrate (which may be formed of silicon, for example) of the device die may be significantly different from the CTE of the interposer, which may comprise organic materials. Hence, in conventional packages, there was a significant warpage in the result package due to the mismatched CTEs of the substrate of the device die and the interposer. In the embodiments of the present disclosure, however, since the device die is embedded in the through-opening in the interposer, there is no CTE mismatch occurring to the opposite sides of the interposer. In addition, since the vias in the interposer may overlap conductive pipes and the regions encircled by the conductive pipes, the area of the interposer is used more efficiently for routing RDLs, and the RDLs may be made shorter. Furthermore, the using of the interposer makes the reduction of the solder regions connecting the top package to the package substrate possible. The reliability of the packages formed in accordance with the embodiments of the present disclosure is high. Experiment results indicated that the packages formed in accordance with the embodiments of the present disclosure have a higher assembly yield and improved reliability in temperature cycle test and drop test over conventional POP structures.

In accordance with some embodiments, an interposer includes a core dielectric material, a conductive pipe penetrating through the core dielectric material, and a metal pad underlying the conductive pipe. The metal pad includes a center portion overlapped by a region encircled by the conductive pipe, and an outer portion in contact with the conductive pipe. A dielectric layer is underlying the core dielectric material and the metal pad. A via is in the dielectric layer, wherein the via is in physical contact with the center portion of the metal pad.

In accordance with other embodiments, a package includes an interposer, which includes a core dielectric material, a through-opening extending from a top surface to a bottom surface of the core dielectric material, a conductive pipe penetrating through the core dielectric material, a device die in the through-opening, and a molding material in the through-opening. The package further includes a top package, and a solder region bonding the top package to the conductive pipe, wherein the solder region extends into an opening in the conductive pipe.

In accordance with yet other embodiments, a method includes placing an interposer on a carrier. The interposer includes a core dielectric material, a conductive pipe penetrating through the core dielectric material, and a metal pad underlying the conductive pipe. The metal pad includes a center portion overlapping a region encircled by the conductive pipe, and an outer portion in contact with the conductive pipe. The method further includes placing a die in a through-opening of the interposer, and molding the interposer and the die using a molding material. After the step of molding, the conductive pipe is exposed. The interposer and the die in combination are demounted from the carrier. A dielectric layer is formed to contact the metal pad and electrical connectors of the die. Redistribution lines are then formed. The redistribution lines include a via in the dielectric layer, wherein the via is in physical contact with the center portion of the metal pad.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
    an interposer comprising:
        a core dielectric material;
        a through-opening extending from a top surface to a bottom surface of the core dielectric material;
        a conductive pipe penetrating through the core dielectric material;
        a first device die in the through-opening, wherein the first device die comprises electrical connectors;
        a molding material in the through-opening over the first device die and between the core dielectric material and the first device die;
    a top package; and
    a solder bonding the top package to the conductive pipe, wherein the solder extends into the conductive pipe.

2. The package of claim 1 further comprising:
    a metal pad underlying the conductive pipe, wherein the metal pad comprises:
        a center portion overlapped by a solder in the conductive pipe; and
        an outer portion in contact with a perimeter of the conductive pipe;
    a dielectric layer underlying the core dielectric material and the metal pad; and
    a via in the dielectric layer, wherein the via is in physical contact with the center portion of the metal pad.

3. The package of claim 1 further comprising:
    a metal line underlying and connected to the via; and
    a solder ball underlying and electrically coupled to the metal line.

4. The package of claim 1, wherein the molding material comprises a portion overlapping the first device die, and wherein a top surface of the molding material is level with a top surface of the interposer.

5. The package of claim 1, wherein a bottom surface of the molding material is level with bottom ends of the electrical connectors of the first device die.

6. The package of claim 1, wherein the top package comprises:
a package substrate; and
a second device die bonded to the package substrate.

7. The package of claim 6, wherein the solder is in contact with a metal pad in the package substrate.

8. The package of claim 1, wherein the electrical connectors of the device die face away from the top package.

9. A package comprising:
an interposer comprising:
a core dielectric material;
a conductive pipe penetrating through the core dielectric material;
a metal pad underlying the conductive pipe;
a dielectric layer underlying the core dielectric material and the metal pad;
a top package; and
a solder region bonding the top package to the conductive pipe, wherein the solder region extends into the conductive pipe.

10. The package of claim 9, wherein the metal pad comprises:
a center portion overlapped by a region encircled by the conductive pipe; and
an outer portion in contact with the conductive pipe.

11. The package of claim 10, wherein the outer portion of the metal pad extends beyond a perimeter of the conductive pipe.

12. The package of claim 10 further comprising a via in the dielectric layer, wherein the via is in physical contact with the center portion of the metal pad.

13. The package of claim 12 further comprising:
a metal line underlying and connected to the via; and
an electrical connector underlying and electrically coupled to the metal line.

14. The package of claim 9, wherein the conductive pipe comprises a metal selected from the group consisting essentially of copper, aluminum, tungsten, nickel, and combinations thereof.

15. The package of claim 9 further comprising a device die, wherein the interposer further comprises:
a through-opening, with the device die in the through-opening; and
a plurality of conductive pipes penetrating through the core dielectric material, wherein the plurality of conductive pipes is disposed in a region encircling the through-opening.

16. The package of claim 9, wherein the conductive pipe is empty inside.

17. A package comprising:
an interposer comprising:
a through-opening extending from a top surface to a bottom surface of the interposer;
a conductive pipe penetrating through the interposer;
a metal pad underlying and in contact with the conductive pipe;
a device die in the through-opening, wherein a bottom surface of the device die is substantially level with a bottom surface of the metal pad;
a top package; and
a solder region bonding the top package to the conductive pipe.

18. The package of claim 17 further comprising a molding material in the through-opening and in contact with over device die.

19. The package of claim 17, wherein the solder region extends into the conductive pipe.

20. The package of claim 19, wherein the solder region contacts a top surface of the metal pad.

* * * * *